(12) United States Patent
Wong et al.

(10) Patent No.: US 7,593,485 B2
(45) Date of Patent: *Sep. 22, 2009

(54) WIRELESS RECEIVER FOR REMOVING DIRECT CURRENT OFFSET COMPONENT

(75) Inventors: Man Shing Wong, Hong Kong (HK); Daniel B. Schwartz, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 602 days.

This patent is subject to a terminal disclaimer.

(21) Appl. No.: 11/443,199

(22) Filed: May 30, 2006

(65) Prior Publication Data

US 2007/0280379 A1    Dec. 6, 2007

(51) Int. Cl.
*H04L 25/06* (2006.01)
(52) U.S. Cl. .................. 375/319; 375/316; 455/313
(58) Field of Classification Search .......... 370/206; 375/298, 316, 319, 332; 455/313
See application file for complete search history.

(56) References Cited

U.S. PATENT DOCUMENTS 4,887,050 A * 12/1989 Borth et al. ............... 331/34

| 2003/0142234 A1* | 7/2003 | Dent | 348/554 |
| 2003/0174641 A1* | 9/2003 | Rahman | 370/206 |
| 2005/0009493 A1* | 1/2005 | Yang et al. | 455/313 |
| 2007/0253510 A1* | 11/2007 | Danz | 375/298 |

* cited by examiner

*Primary Examiner*—Chieh M Fan
*Assistant Examiner*—Leon-Viet Q Nguyen
(74) *Attorney, Agent, or Firm*—Charles Bergere

(57) ABSTRACT

A wireless receiver includes a hardware (HW) block, a converter block and a digital signal processor (DSP). The HW block receives a wireless signal having a first DC Offset Component (DCOC), removes a portion of the first DCOC to produce a residual DCOC centered at DC, and generates parameters that estimate the residual DCOC. The converter block is coupled to the HW block and receives the residual DCOC centered at DC and converts it to a residual DCOC centered at IF. The DSP is coupled to the HW block and the converter block and receives the residual DCOC centered at IF from the converter block and the parameters from the HW block, and uses the parameters to eliminate the residual DCOC, and generate a baseband signal that is substantially free of the first DCOC and the residual DCOC.

12 Claims, 6 Drawing Sheets

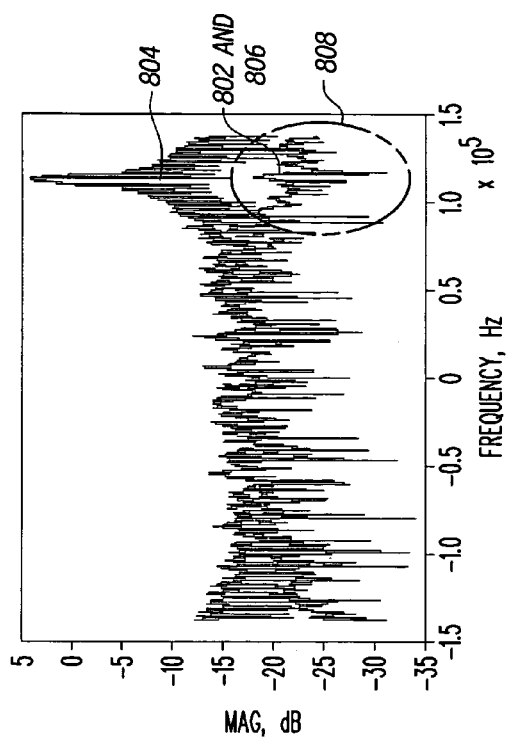
FIG. 8
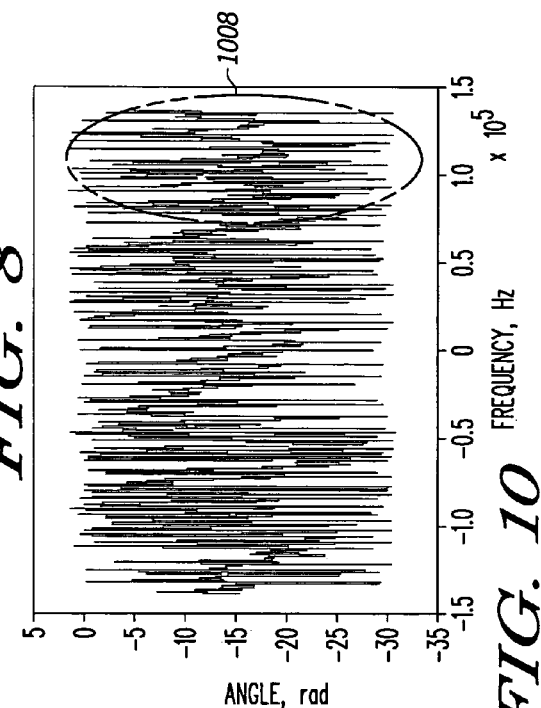
FIG. 10
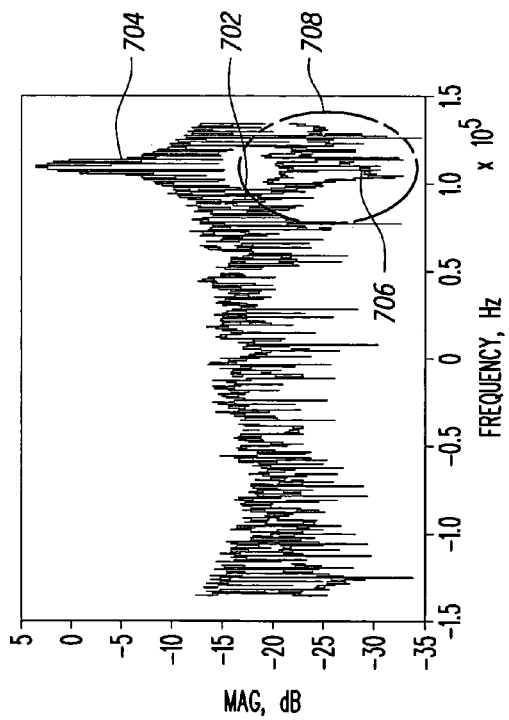
FIG. 7 —PRIOR ART—
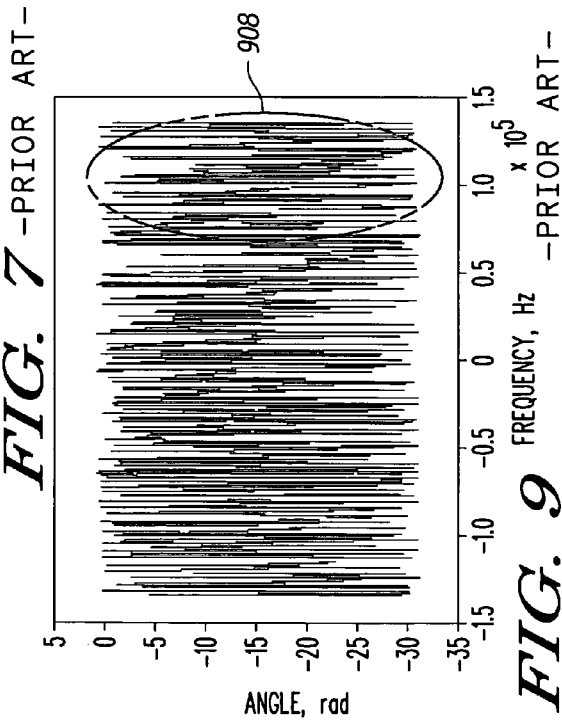
FIG. 9 —PRIOR ART—

WIRELESS RECEIVER FOR REMOVING DIRECT CURRENT OFFSET COMPONENT

BACKGROUND OF THE INVENTION

The present invention relates generally to wireless communications and more particularly to a method and apparatus for removing a Direct Current Offset Component (DCOC) from a baseband signal in a wireless receiver, such as a Global System for Mobile communication (GSM)/Enhanced Data rate for GSM Evolution (EDGE) receiver.

Very low intermediate (VLIF) receivers used in wireless communication devices typically include a high pass filter (HPF) for removing the DCOC from an intermediate frequency (IF) signal that passes through the receiver component before the IF signal is down converted to a baseband frequency. For example, a GSM/EDGE receiver can include a finite impulse response high pass filter (FIR HPF) that partially removes the DCOC before the IF signal (e.g., a 110 kHz GMSK/8 PSK signal) is down converted to the baseband frequency.

Unfortunately, using a FIR HPF to partially remove the DCOC can cause gain and phase distortion to the IF signal, thus degrading the receiver performance. One approach to improving the performance is to reduce the notch bandwidth of the FIR HPF. However, using a FIR HPF with a smaller notch bandwidth results in longer latency, which extends the receiver set up time making it difficult to support a multi-slot receiver. As such, using a FIR HPF to reduce the DCOC requires a tradeoff between latency and signal quality.

It would be desirable to provide improved techniques for efficiently removing the DCOC from an intermediate frequency (IF) signal before the IF signal is down converted to baseband frequency. It would be particularly desirable if such techniques exhibit low latency, while preserving signal spectrum with minimum gain and phase distortion.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

FIG. 7 is a graph showing gain (dB) versus frequency (Hz) in a conventional receiver that uses a high pass filter (HPF) for DCOC removal;

FIG. 8 is a graph showing gain (dB) versus frequency (Hz) in a receiver implementing aspects of the DCOC System for DCOC removal in accordance with the present invention;

FIG. 9 is a graph showing phase angle (radians) versus frequency (Hz) in a conventional receiver that uses a high pass filter (HPF) for DCOC removal; and FIG. 10 is a graph showing phase angle (radians) versus frequency (Hz) in a receiver implementing aspects of the DCOC System for DCOC removal in accordance with the present invention.

Figure 1:
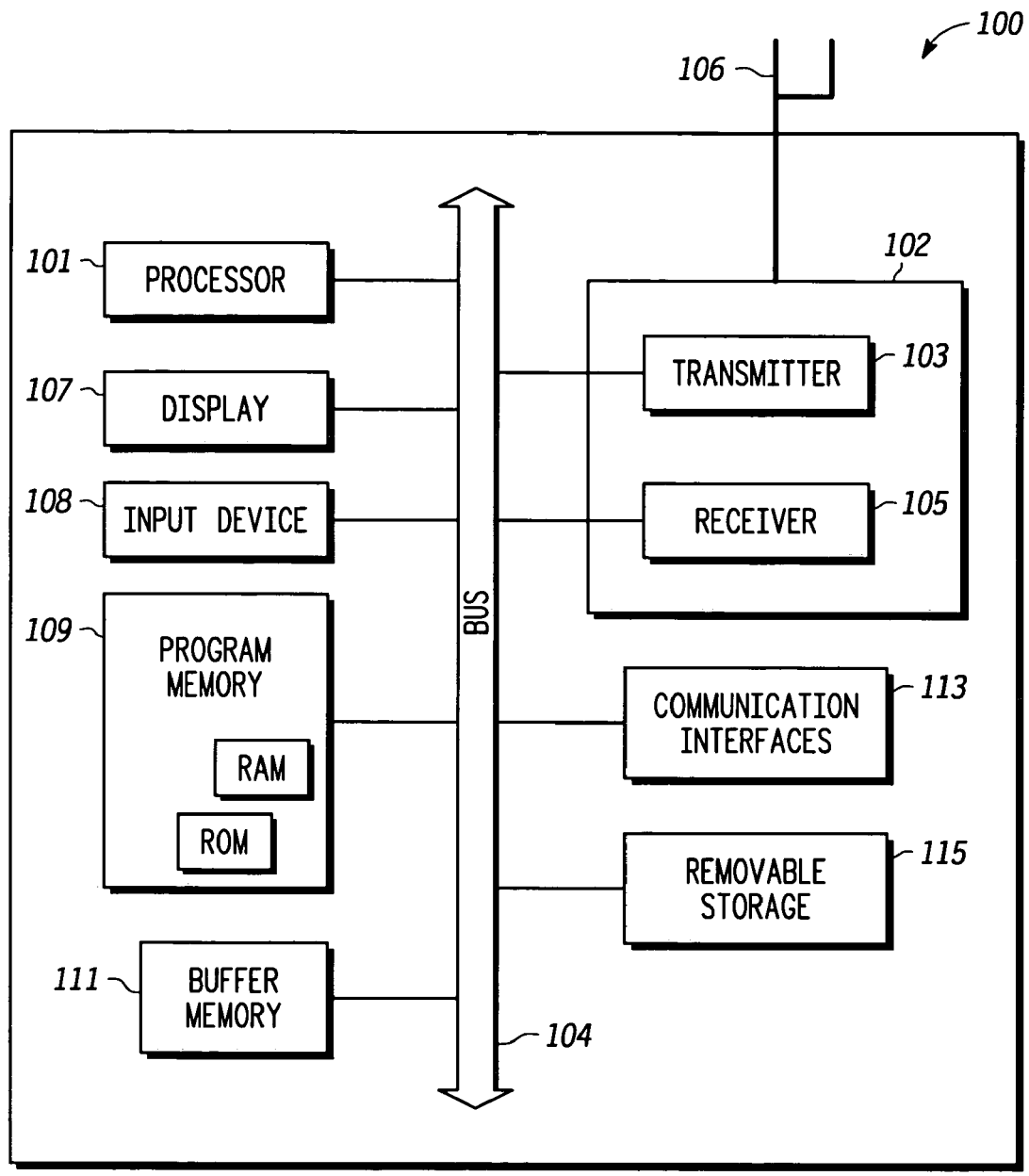
FIG. 1 is a schematic block diagram of an exemplary wireless communication device in accordance with an embodiment of the present invention.

Those of skill in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

The present invention includes combinations of method steps and apparatus components for efficiently removing the DC offset component in an intermediate frequency (IF) signal before the IF signal is down converted to baseband frequency. Accordingly, the apparatus components and method steps have been represented where appropriate by conventional symbols in the drawings, showing only those specific details that are pertinent to understanding the present invention so as not to obscure the disclosure with details that will be understood or readily apparent to those of ordinary skill in the art having the benefit of the description herein.

In this document, relational terms such as first and second, top and bottom, and the like may be used to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may include one or more conventional processors and unique stored program instructions that control the one or more processors to implement, in conjunction with certain non-processor circuits, some, most, or all of the functions described herein for efficiently removing the DC offset component in an intermediate frequency (IF) signal before the IF signal is down converted to a baseband frequency. The non-processor circuits may include, but are not limited to, a radio receiver, a radio transmitter, signal drivers, clock circuits, power source circuits, and user input devices. As such, these functions may be interpreted as steps of a method for efficiently removing the DC offset component in an intermediate frequency (IF) signal before the IF signal is down converted to a baseband frequency. Alternatively, some or all functions may be implemented by a state machine that has no stored program instructions, or in one or more application specific integrated circuits (ASICs), in which each function or some combinations of certain of the functions are implemented as custom logic. Of course, a combination of the two approaches may be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The exemplary embodiments described below relate to an apparatus, system and method for efficiently removing the DC offset component from an intermediate frequency (IF) signal before the IF signal is down converted to baseband frequency. These techniques can be implemented in a wireless receiver to remove a DC offset component before the IF signal is down converted to baseband frequency. The DC offset component can be efficiently removed with low latency, while preserving the signal spectrum with minimum gain and phase distortion.

The present invention is a wireless receiver including a hardware (HW) block, a converter block and a digital signal processor (DSP). The HW block receives a wireless signal having a first DC Offset Component (DCOC), removes a portion of the first DCOC to produce a residual DCOC centered at DC, and generates parameters that estimate the residual DCOC. The converter block is coupled to the HW block and receives the residual DCOC centered at DC and converts it to a residual DCOC centered at IF. The DSP is coupled to the HW block and the converter block and receives the residual DCOC centered at IF from the converter block and the parameters from the HW block, and uses the parameters to eliminate the residual DCOC, and generate a baseband signal that is substantially free of the first DCOC and the residual DCOC.

The present invention further provides, in a wireless receiver that processes a digital signal having a DC Offset Component (DCOC), a method of generating a baseband signal. The method includes the steps of, in a hardware (HW) block, receiving the digital signal and removing a portion of the DCOC to produce a residual DCOC centered at DC, and generating parameters that estimate the residual DCOC; in a converter block coupled to the HW block, receiving the residual DCOC centered at DC and converting the residual DCOC centered at DC to a residual DCOC centered at intermediate frequency (IF); and in a digital signal processor (DSP) coupled to the HW block and the converter block that receives the residual DCOC centered at IF from the converter block and the parameters from the HW block, using the parameters to eliminate the residual DCOC, and generating a baseband signal that is substantially free of the DCOC.

Referring now to FIG. 1, a schematic block diagram of an exemplary Wireless Communication Device (WCD) 100 operable in a wireless network in accordance with some embodiments of the invention is shown. The WCD 100 is capable of receiving and transmitting packetized audio, video and/or data information. The WCD 100 can transmit and receive information packets over wireless carrier frequencies, each of which includes one or more wireless communication channels.

A typical wireless network (not shown) provides multiple users access to one or more shared resources. A system may use a variety of multiple access techniques such as Frequency Division Multiplexing (FDM), Time Division Multiplexing (TDM), Code Division Multiplexing (CDM), and others. Example wireless networks include cellular-based data systems. The following are several such examples: (1) the "TIA/EIA-95-B Mobile Station-Base Station Compatibility Standard for Dual-Mode Wideband Spread Spectrum Cellular System" (the IS-95 standard), (2) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (3) the standard offered by a consortium named "3rd Generation Partnership Project 2" (3GPP2) and embodied in "TR-45.5 Physical Layer Standard for cdma2000 Spread Spectrum Systems" (the IS-2000 standard), and (4) the high data rate (HDR) system that conforms to the TIA/EIA/IS-856 standard (the IS-856 standard).

When the WCD 100 is within communication range of a cellular base station (not shown) that is part of a cellular-based network (not shown), the WCD 100 can operate in a cellular mode to transmit and/or receive information directly to and from the cellular base station. The WCD 100 can communicate information packets with the cellular base station over wireless carrier frequencies, each of which includes one or more wireless communication channels depending on the multiple access scheme used in the cellular-based network.

Examples of multiple access schemes which can be used in the network can include any one or more of time division multiple access (TDMA), direct sequence or frequency hopping code division multiple access (CDMA), frequency division multiple access (FDMA), orthogonal frequency division multiplexing (OFDM), opportunity division multiple access (ODMA), a combination of any of the foregoing multiple access technologies, a multiple access technology in which portions of the frequency spectrum to be used are determined by local signal quality measurements and in which multiple portions of the frequency spectrum may be used simultaneously, or any other multiple access or multiplexing methodology or combination thereof.

For example, the WCD 100 can support communication in compliance with at least the following communication standards: (1) the "TIA/EIA-95-B Mobile Station-Base Station Compatibility Standard for Dual-Mode Wideband Spread Spectrum Cellular System" (referred to herein as the IS-95 standard), (2) the "TIA/EIA-98-D Recommended Minimum Standard for Dual-Mode Wideband Spread Spectrum Cellular Mobile Station" (the IS-98 standard), (3) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (referred to herein as the W-CDMA standard), (4) the standard offered by a consortium named "3rd Generation Partnership Project 2" (3GPP2) and embodied in a set of documents including Document Nos. C.S0002-A, C.S0005-A, C.S0010-A, C.S0011-A, C.S0024, and C.S0026 (referred to herein as the cdma2000 standard), and (5) other standards. These standards are incorporated herein by reference in their entirety.

The WCD 100 includes a processor 101, a transceiver 102 including a transmitter circuit 103 and a receiver circuit 105, an antenna 106, a display 107, an input device 108, a program memory 109 for storing operating instructions that are executed by the processor 101, a buffer memory 111, and a removable storage unit 115, which can communicate with each other by way one or more busses 104.

Although not shown, the WCD 100 also preferably includes an antenna switch, duplexer, circulator, or other highly isolative means (not shown) for intermittently providing information packets from the transmitter circuit 103 to the antenna 106 and from the antenna 106 to the receiver circuit 105. The WCD 100 is preferably an integrated unit that may contain at least the elements depicted in FIG. 1, as well as any other elements necessary for the WCD 100 to perform its particular functions. Alternatively, the WCD 100 may comprise a collection of appropriately interconnected units or devices, wherein such units or devices perform functions that are equivalent to the functions performed by the elements of the WCD 100. For example, the WCD 100 may be implemented as a computer with a wireless local area network (WLAN) card.

The processor 101 can include one or more microprocessors, microcontrollers, DSPs (digital signal processors), state machines, logic circuitry, or any other device or devices that process information based on operational or programming instructions. Such operational or programming instructions are preferably stored in the program memory 109. The program memory 109 can be an IC (integrated circuit) memory chip containing any form of RAM (random-access memory) or ROM (read-only memory), a CD-ROM (compact disk read-only memory), a hard disk drive, a DVD (digital video disc), a flash memory card or any other medium for storing digital information. One of ordinary skill in the art will recognize that when the processor 101 has one or more of its functions performed by a state machine or logic circuitry, the program memory 109 containing the corresponding operational instructions may be embedded within the state machine or logic circuitry. The operations performed by the processor 101 and the rest of the WCD 100 are described in detail below.

The transmitter circuit 103 and the receiver circuit 105 enable the WCD 100 to communicate information packets to and acquire information packets from other WCDs within the communication network. In this regard, the transmitter circuit 103 and the receiver circuit 105 include circuitry to enable digital or analog transmissions over a wireless communication channel. The transmitter and receiver circuits 103 and 105 are designed to operate over a cellular air interface (e.g., Global System for Mobile communication (GSM), Code Division Multiple Access (CDMA), Wide-band CDMA (WCDMA), Universal Mobile Telecommunications System (UMTS), and the like).

The implementations of the transmitter and receiver circuits 103 and 105 depend on the implementation of the WCD 100. For example, the transmitter and receiver circuits 103 and 105 can be implemented as an appropriate wireless modem, or as conventional transmitting and receiving components of two-way wireless communication devices. In the event that the transmitter and receiver circuits 103 and 105 are implemented as a wireless modem, the modem can be internal to the WCD 100 or insertable into the WCD 100 (e.g., embodied in a wireless a radio frequency (RF) modem implemented on a Personal Computer Memory Card International Association (PCMCIA) card). For a wireless communication device, the transmitter and receiver circuits 103 and 105 are preferably implemented as part of the wireless device hardware and software architecture in accordance with known techniques. Most, if not all, of the functions of the transmitter and receiver circuits 103 and 105 can be implemented in a processor, such as the processor 101. However, the processor 101, the transmitter circuit 103, and the receiver circuit 105 have been artificially partitioned herein to facilitate a better understanding of the invention.

The receiver circuit 105 is capable of receiving RF signals from at least one frequency bandwidth and optionally more than one frequency bandwidth, if communications with proximate device are in a frequency band other than that of the network communications. The receiver circuit 105 can optionally comprise a first receiver for receiving signals over a first frequency bandwidth, a second receiver for receiving signals over a second frequency bandwidth, a third receiver for receiving signals over a third frequency bandwidth, a fourth receiver for receiving signals over a fourth frequency bandwidth, etc., or a single receiver capable of receiving signals over multiple different frequency bandwidths. The receiver 105, depending on the mode of operation, can be tuned to receive, for example, Public Land Mobile Radio System (PLMRS), Advanced Mobile Phone Service (AMPS), GSM, CDMA, UMTS, WCDMA) and other types of communication signals. The transceiver 102 includes at least one transmitter circuit 103. The at least one transmitter circuit 103 may be capable of transmitting to multiple devices over multiple frequency bands. As with the receiver 105, multiple transmitters 103 may be employed.

The antenna 106 may be any known or developed structure for radiating and receiving electromagnetic energy in the frequency range containing the wireless communication frequencies. Such antennas are known and readily available.

The display 107 is of a known type, such as an LED or LCD, and may be monochrome or color, and of various sizes and resolutions, as known by those of skill in the art. The input device 108 includes a keypad, touch pad, or the like, as well as a microphone for receiving analog signals, such as voice commands. The buffer memory 111 can be any form of volatile memory, such as RAM, and is used for temporarily storing received information packets. The optional removable storage 115 may be an integrated circuit memory that communicates with the processor 101 via the bus 104 using known standards, such as PCMCIA.

When the WCD 100 is constructed to receive video information from a video source, the WCD 100 preferably further includes a video decoder capable of decoding an encoded video signal, such as a Moving Picture Experts Group (MPEG) standard or some other video decoding standard. When the WCD 100 is capable of transmitting video information, the WCD 100 preferably further includes a video encoder that encodes the video data into at least one of the foregoing video standards. Such video encoder and decoders may be implemented as part of the processor 101.

Figure 2:
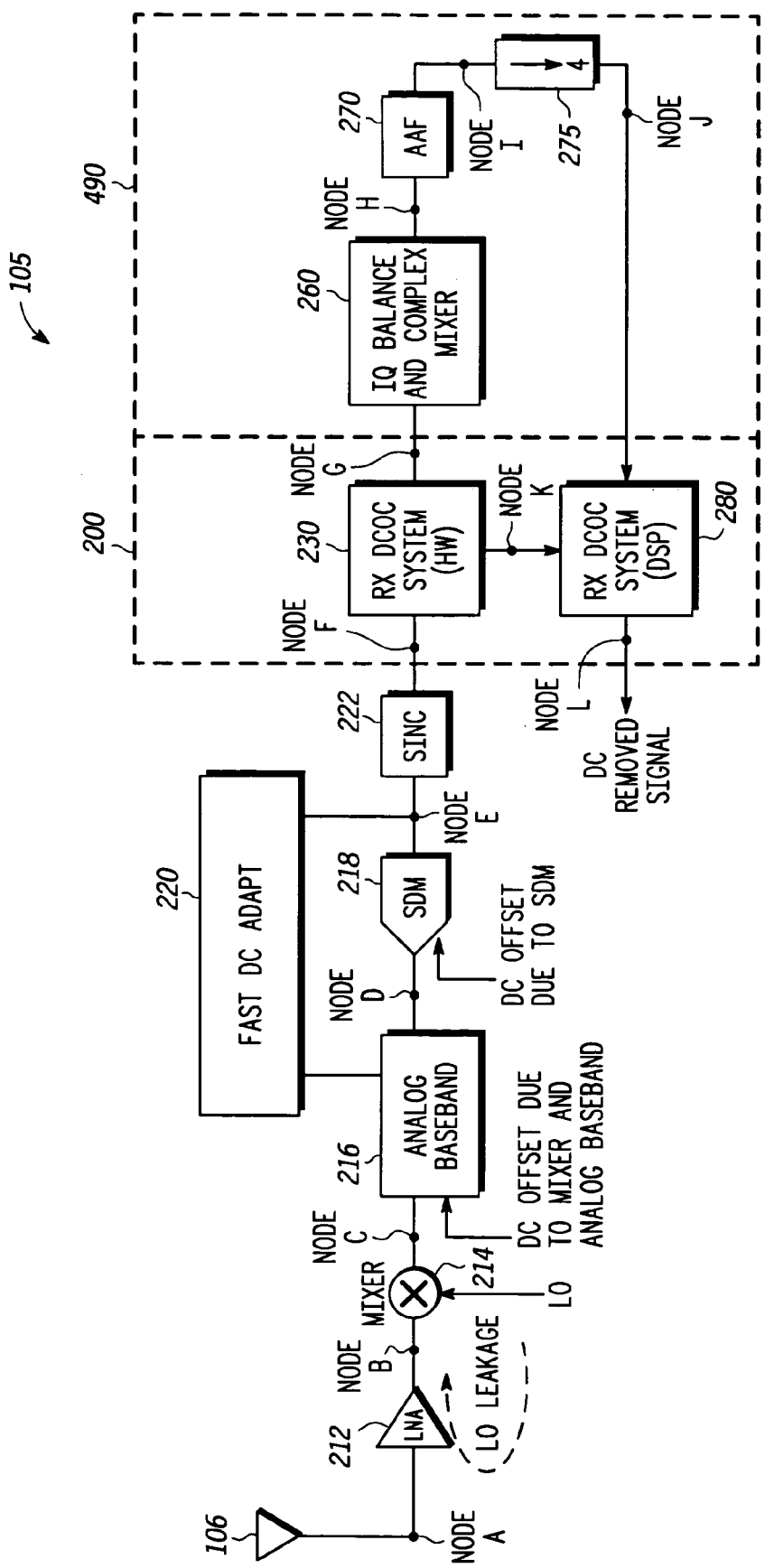
FIG. 2 is a schematic block diagram of an exemplary receiver including a Direct Current Offset Component (DCOC) System in accordance with an embodiment of the present invention.

FIG. 2 is a schematic block diagram of the receiver 105 including a Direct Current Offset Component (DCOC) System 200 in accordance with an embodiment of the present invention. In one implementation, the receiver 105 may be a GSM/EDGE receiver. The receiver 105, in addition to the DCOC system 200, includes a low noise amplifier (LNA) 212, mixer 214, analog baseband processor 216, sigma delta modulator (SDM) 218, fast DC adapt unit 220, SINC filter 222, IQ balance and complex mixer 260, anti-aliasing filer (AAF) 270, and down sampler 275. The DCOC system 200 includes a hardware (HW) block 230 and a digital signal processor (DSP) 280.

As previously discussed, the receiver 105 is connected to the antenna 106 (FIG. 1). The antenna 106 receives an incoming Radio Frequency (RF) signal (e.g., GSM signal at roughly 900 MHz for a GSM receiver). The LNA 212 is coupled between the antenna 106 at node A and the mixer 214 at node B. The LNA 212 amplifies the RF signal and possibly a leakage signal from a Local Oscillator (LO).

The mixer 214 receives the amplified RF signal generated by the LNA 212 and mixes the amplified RF signal with a LO signal (at RF +/− IF frequency) from the Local Oscillator (LO) to generate an IF signal at a real IF frequency (e.g., at about 110 kHz). The mixer 214 is coupled to the analog baseband processor 216 at node C.

The analog baseband processor 216 receives the IF signal from the mixer 214 and a DC offset component (DCOC) that is generated, for example, due to a mismatch between the mixer 214 and analog baseband processor 216, and any LO leakage signal that enters the LNA 212. The analog baseband processor 216 is coupled to the SDM 218 at node D and to the fast DC adapt unit 220. The analog baseband processor 216 amplifies a combined signal that includes the IF signal and the DCOC. The amplified combined signal (IF signal plus DCOC) from the analog baseband processor 216 is sent to the fast DC adapt unit 220. The analog baseband processor 216, SDM 218 and fast DC adapt unit 220 form a closed loop to partially reduce the DC Offset at the input of the SDM unit 218. During the fast DC adapt loop, the corner frequency of the closed loop is set low, such that the settling time is very low and preferably at a minimum. During reception of a normal burst, the fast DC adapt loop is disabled and the analog baseband processor 216 holds the last DC offset correction value provided by the fast DC adapt unit 220 to offset the DC level of the amplified combined signal. In other words, the analog baseband processor 216 generates an analog output signal (IF signal plus a partially reduced DCOC), and provides the analog output signal to the SDM 218 by way of node D.

The fast DC adapt unit 220 receives the amplified combined signal (IF signal plus DCOC). In one implementation, the DCOC is about 300 mV at this stage. The DCOC in a system limits the dynamic range of the SDM 218. The fast DC adapt unit 220 removes (or partially reduces) a portion of the DCOC. For example, in one implementation, the fast DC adapt unit 220 reduces the DCOC by more than a factor of 10 to about 28 mV. By reducing the DCOC at this stage, the fast DC adapt unit 220 helps to ensure that the SDM 218 does not clip the analog output signal and hence does not waste dynamic range.

The SDM 218 is coupled between node D and node E. The SDM 218 receives the analog output signal (IF signal plus a partially reduced DCOC) and an additional DC Offset due to the SDM 218 itself. The SDM 218 converts the analog output signal (IF signal plus a partially reduced DCOC) and any additional DC Offset due to the SDM 218 itself into a digital IF signal. At this point, the digital IF signal output by the SDM 218 still requires further processing before a useful digital signal is obtained.

Figure 3:
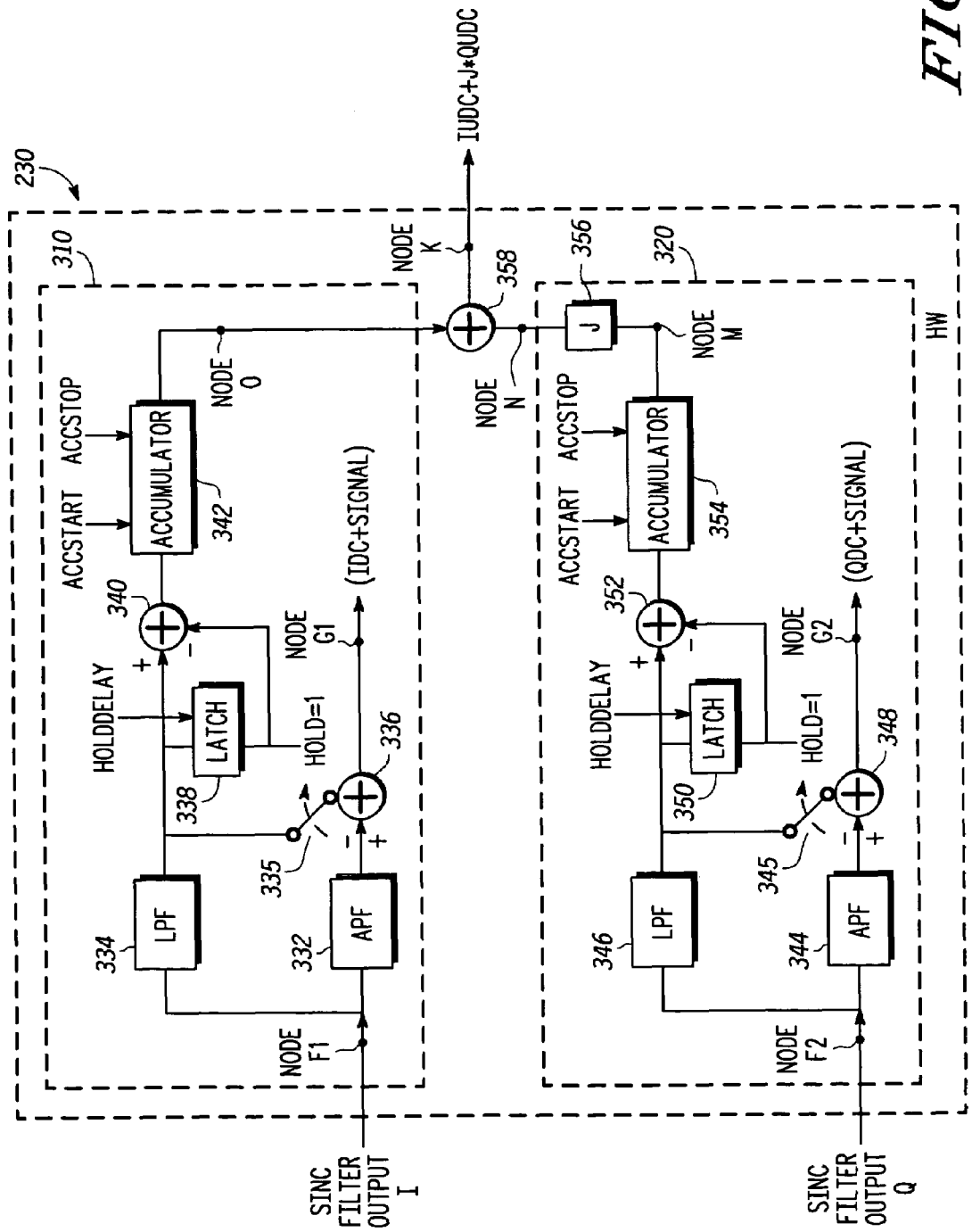
FIG. 3 is a schematic block diagram of a portion of an exemplary hardware unit in accordance with an exemplary implementation of the present invention.

The SINC filter 222 is coupled to the SDM 218 and the fast DC adapt unit 220 at node E, and to the HW block 230 of the DCOC system 200 at node F. The digital IF signal from the SDM 218 passes through the SINC filter 222. As is known by those of skill in the art, a SINC filter is used to separate one band of frequencies from another. Here, the SINC filter 222 centers the digital signal at a real IF frequency. The centered signal has a reduced DCOC, also referred to herein as an "actual" DCOC or $1^{st}$ DCOC. In one implementation, at this stage, the DCOC is roughly 28 mV. As shown in FIG. 3 and discussed below, the centered IF signal with reduced DC offset output by the SINC filter 222 has both an in-phase (I) component and a quadrature-phase (Q) component.

As noted above, the fast DC adapt unit 220 helps remove or partially reduce a portion of the DCOC. For improved receiver performance, it is desirable to reduce the DCOC to about 10 μV (e.g., by a reduction factor of about 1000).

To further reduce the DCOC, the centered signal is input to the DCOC System 200. The DCOC System 200 is coupled between nodes F and L and in this embodiment comprises the HW block 230 and the DSP 280.

The HW block 230 receives the centered signal and the reduced DCOC output from the SINC filter 222. At node G, the HW block 230 generates a first complex signal comprising an IF signal and reduced DCOC at node G. The HW block 230 also generates parameters, also referred to herein as a composite DCOC estimate, which are sent to the DSP 280 at node K in order to estimate the DC offset component.

The IQ balance and complex mixer 260 is coupled to the HW block 230 at node G. The IQ balance and mixer 260 balances and down converts the output signal from the HW block 230 to a baseband signal and up converts the reduced DCOC signal to an IF signal centered at DC. The baseband signal is then sent to the AAF 270, which filters the out of band IF frequencies before down sampling in order to reduce the aliasing effect. The AAF 270 is coupled to the down sampler 275 at node I. The bandwidth limited baseband signal from the AAF 270, which still includes the residual DCOC, is provided to the down sampler 275. The down sampler 275 converts the bandwidth limited signal into a baseband signal centered at DC and a residual DCOC centered at IF. The DC centered baseband signal is then provided to the DSP 280, which is coupled to the down sampler 275 at node J.

The DSP 280 receives the DC centered baseband signal and the residual DCOC centered at IF, and the parameters generated by the HW block 230 for estimating the residual DCOC and removes the residual DCOC from the baseband signal generated by the down sampler 275. As will be discussed in more detail below, the DSP 280 generates a baseband signal (centered at DC) that is substantially or completely free of a DC offset component (DCOC) and outputs such signal at node L.

FIG. 3 is a block diagram of an embodiment of the HW block 230 unit in accordance with the present invention. The HW 230 includes an in-phase (I) path 310 and a quadrature (Q) path 320. The inputs I and Q to the HW block 230 at nodes F1, F2 are generated by the SINC filter 222 shown in FIG. 2. The I path 310 include an all-pass filter (APF) 332, low-pass filter (LPF) 334, first switch 335, subtractors 336, 340, latch 338, and accumulator 342. Similarly, the Q path 320 includes an all-pass filter (APF) 344, low-pass filter (LPF) 346, second switch 345, subtractors 348, 352, latch 350, accumulator 354, and complex multiplier 356. The output of the I path accumulator 342 and the output of the Q path complex multiplier 356 are input to an adder 358, which provides the node K output of the HW block 230, which is input to the DSP 280 (FIG. 2). The outputs of the subtractors 336 and 348 are the node G outputs (i.e., nodes G1 and G2) of the HW block 230 that are input to the IQ balance and complex mixer 260.

More particularly, the I path 310 receives an in-phase signal (I) from the SINC filter 222 at node F1, and provides the in-phase signal (I) to the APF 332 and LPF 334. The in-phase signal (I) is an in-phase component of the IF signal and a first "actual" DCOC in in-phase. The in-phase signal (I) passes through both the APF 332 and/or the LPF 334 to either the subtractor 336 or latch 338 depending on the state of the first switch 335 that is coupled to the subtractor 336. The state of the first switch 335 is controlled via a parameter "hold delay" at the latch 338. The hold delay parameter allows the DC offset removal to be split into two portions.

When the hold delay parameter is equal to "0", as shown in FIG. 3, the first switch 335 completes the path between the LPF 334 and the subtractor 336. The first switch 335 ensures a smooth transition between two operations and does not introduce any transient response that distorts the signal. The resultant combination of the output of the LPF 334 subtracted from the output of the APF 332 is equivalent to a FIR high pass filter (HPF). The Rx DCOC System 200 removes DC offset without added filter latency.

When the hold delay parameter is equal to "1", a portion of the residual DCOC is removed and the latency of the system is equivalent to a traditional FIR HPF. More particularly, when the hold delay parameter is equal to "1", the output of the LPF 334, which is a DC estimate, is stored in the latch 338, and the first switch 335 completes the path between the subtractor 336 and the latch 338. The entire IF signal and first "actual" DCOC in in-phase pass through the APF 332 and the subtractor 336 subtracts the DC estimate held in the latch 338 from the output of the APF 332. In this way, the latency of the system is equivalent to the latency in the APF 332; the latency associated with combined FIR HPF is similar to the latency associated with the APF 332. As such, the latency of the Rx DCOC system 200 is dependent on the APF 332. The resulting output at node G1 after the hold delay has expired is a first residual DCOC (Idc) plus the in-phase (I) component of the IF signal. The first residual DCOC (Idc) which remains can then be removed by the DSP 280, as will be described below with reference to FIG. 4.

The difference between the output of the LPF 334 and the DC estimate held in the latch 338 generated by the subtractor 340 (which corresponds to the first residual DCOC) is provided to the accumulator 342. The accumulator 342 accumulates the difference during a period (or accumulation window) defined by two parameters "accstart" and "accstop." The output of the accumulator 342 is the first residual DCOC estimate (Iudc) for the window defined by accstart and accstop. Note that Iudc is a constant value, not a function of time. Accstart is defined as the time corresponding to the start of the first data sent to the DSP 280 plus the latency in IQ Balance and Complex Mixer unit 260, AAF unit 270 and down sampler unit 275. The output of the accumulator 342 (e.g., first residual DCOC estimate centered at DC) is provided to the adder 358.

The Q path 320 is similar to the I path 310 except that the Q path receives a quadrature-phase (Q) output of the SINC filter at node F2. The Q path 320 also includes the complex multiplier 356. The quadrature-phase (Q) output comprises the Q component of the IF signal and a first actual DCOC in quadrature phase. Essentially the same process described above with respect to the I path 310 is performed by the Q path 320, except that the output of the accumulator 354 (Qudc) is provided to the complex multiplier 356. The output of the complex multiplier 356 (jQudc) is then provided to the adder 358. The complex multiplier 356 is a conceptual component used to indicate that the output of the accumulator 354 is the quadrature-phase. In an actual hardware implementation, this can be accomplished by hard wiring the output to the imaginary part at the output of the adder 358 at node K.

The outputs from the I path 310 (e.g., Iudc) and Q path 320 (e.g., jQudc) are provided to the adder 358 from nodes O and N, respectively. The adder 358 adds the output from the I path 310 and Q path 320 to generate an adder output signal comprising Iudc+jQudc, which corresponds to one output of the HW block 230.

Thus, the DC offset is partially removed by the constant DC estimate held in the latches 338, 350, and the residual DC offset component (DCOC) remains. The remaining portion of the residual DCOC is removed by the DSP 280 where the parameters sent from the HW block 230 allow the DSP 280 to estimate the residual DC offset. The DSP 280 estimates and removes the remaining portion of the DCOC without causing in-phase distortion. The Idc+jQdc are the residual DC components left to be removed by the DSP 280, as discussed below with reference to FIG. 4.

Figure 4:
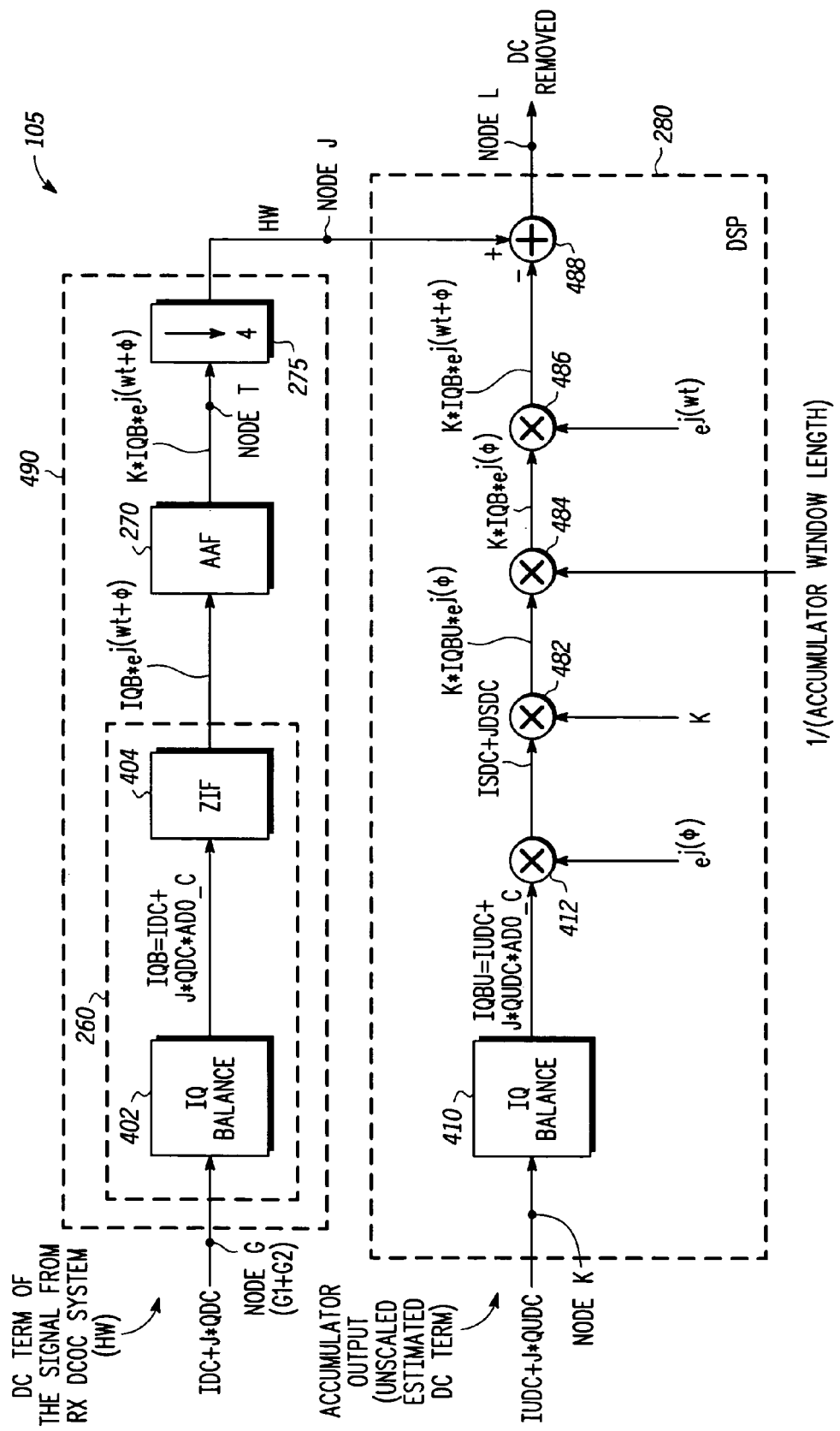
FIG. 4 is a schematic block diagram of a portion of a receiver with a bottom branch that includes an exemplary Digital Signal Processor (DSP) unit, and a top branch that couples an exemplary hardware unit to the DSP unit in accordance with an exemplary implementation of the present invention.

FIG. 4 is a more detailed schematic block diagram of a portion of the receiver 105, which includes a converter block 490 coupled to the DSP 280. The converter block 490 includes the IQ balance and complex mixer 260, the AAF 270 and the down sampler 275 (or downsample-by-4). The IQ balance and complex mixer 260 includes a first IQ balance unit 402 and complex mixer (ZIF) 404. It will be appreciated by those of skill in the art that the diagram illustrates functions performed by the DSP 280 and not necessarily separate components of the DSP 280. While the input at node G includes an IF signal and a DCOC (Idc+jQdc), and the input at node K includes a composite DCOC estimate (a complex constant value), respectively, the following description primarily focuses on the processing of the DCOC and the composite DCOC estimate.

Figure 5:
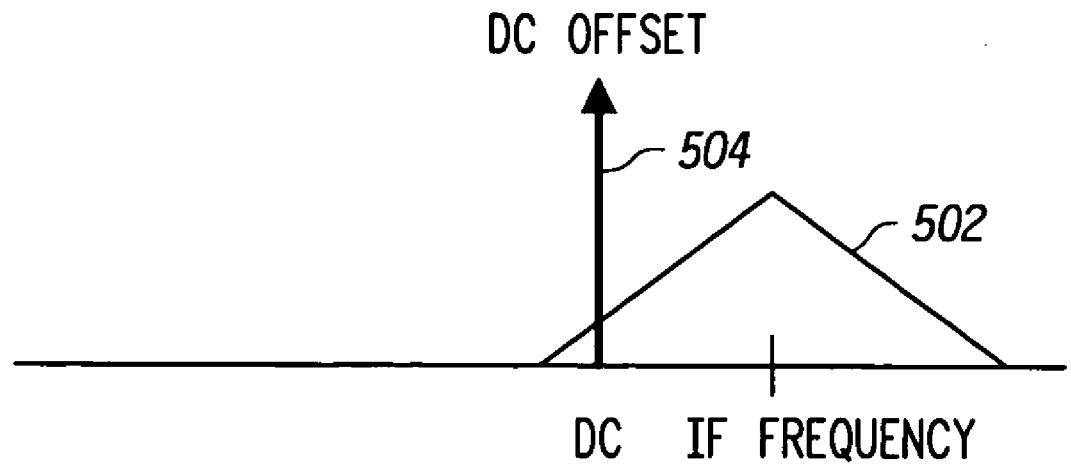
FIG. 5 is a graph showing an input into an IQ balance unit, and the position of an IF signal and DCOC in accordance with an exemplary implementation of the present invention.

The first IQ balance unit 402 is coupled to nodes G1 and G2 in FIG. 3. The first IQ balance unit 402 receives an RF (e.g., GSM) signal centered at the IF frequency and the DC term (i.e., the first and second residual DCOC signals) from the HW block 230 centered at DC, where the DC term of the signal from the HW block 230 is denoted as Idc+jQdc. At this point the RF signal has not yet been down converted to baseband frequency. Referring to FIG. 5, a graph illustrating the RF signal from the HW block at the node G that is input into the first IQ balance unit 402. The RF signal includes an IF signal 502 and residual DCOC 504 as the signal enters the first IQ balance unit 402.

The first IQ balance unit 402 compensates for the I and Q path gain/phase mismatch and outputs a DCOC signal IQB=Idc+jQdc*ad0_C, where "ad0_C" is the first order IQ balance unit 402 terms. The first IQ balance unit 402 is coupled to the complex mixer (ZIF) 404. The complex mixer (ZIF) 404 receives the DCOC signal IQB at DC, and up mixes it to the IF frequency and phase of the complex mixer (ZIF) 404 at accstart (the parameter for the accumulator 342 in FIG. 3). The complex mixer 404 generates an up-converted IF signal $IQB*e^{j(wt+\phi)}$, where "$\phi$" is the phase of the complex mixer 404 at accstart, "w" is the IF frequency, and "t" is time.

The complex mixer (ZIF) 404 is coupled to the AAF 270. The AAF 270 receives the up converted DCOC signal, $IQB*e^{j(wt+\phi)}$, from the complex mixer (ZIF) 404. When the up converted DCOC signal passes through the AAF 270, the AAF 270 attenuates the DCOC at IF frequency of the input signal by a factor "K" (the attenuation of the AAF 270 at the corresponding down converted DC component frequency) to generate an attenuated DCOC signal at IF frequency ($KIQB*e^{j(wt+\phi)}$). The value of the factor K is less then one. The AAF 270 allows the down sampler 275 to down-sample the attenuated baseband signal without aliasing effect, which would distort or lose information from the original signal. The down sampler 275, which is coupled to the AAF 270, receives the attenuated DCOC signal at IF frequency $KIQB*e^{j(wt+\phi)}$ and reduces the sampling rate by 4, as shown in FIG. 6.

Figure 6:
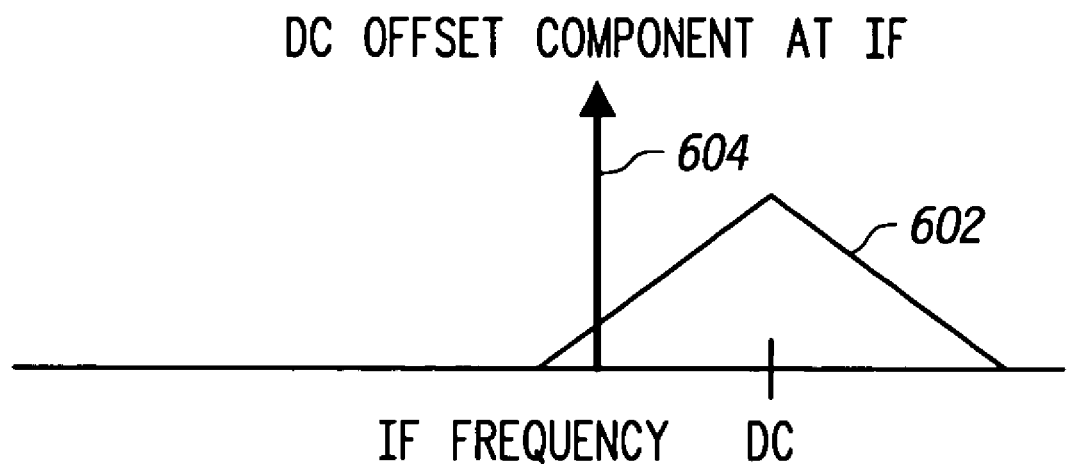
FIG. 6 is a graph illustrating a baseband signal at baseband frequency and DCOC in accordance with an exemplary implementation of the present invention.

FIG. 6 is a graph illustrating a baseband (e.g., GSM) signal 602 centered at DC and the residual DCOC 604 centered at IF after passing through the down sampler 275 and before being combined with a signal generated by the Rx DCOC DSP 280. As compared to FIG. 5, the baseband signal 602 and the residual DCOC 604 centered at IF have retained their basic shape, however, the frequencies at which they are centered have changed. That is, the baseband signal 602 is now centered at DC and the DC offset component 604 is now centered at IF frequency.

Referring again to FIG. 4, the DSP 280 includes a second IQ balance unit 410, a complex mixer 412, multipliers 482, 484, 486 and subtractor 488.

The DSP 280 receives the composite accumulator DCOC estimates (Iudc+jQudc), a complex constant value, generated at node K in FIG. 3 and manipulates the composite accumulator DCOC estimates (Iudc+jQudc) to generate an estimated DCOC signal at IF frequency that is substantially identical to the residual DCOC generated by the converter block 490. As such, when the signal from the multiplier 486 is subtracted from the signal from the converter block 490 at the subtractor 488, the residual DCOC, denoted by Idc+jQdc, is eliminated.

In FIG. 3, the adder 358 generates the composite accumulator DCOC estimates (Iudc+jQudc) at DC. The composite accumulator DCOC estimates (Iudc+jQudc) at DC are input to the second IQ balance unit 410. The second IQ balance unit 410 balances the adder 358 output signal (Iudc+jQudc) to generate an IQ balanced signal, IQBU=Iudc+jQudc*ad0_C.

The complex mixer 412 receives the IQBU signal generated by the second IQ balance unit 410, and a complex input ($e^{j\Phi}$), and mixes these two signals to generate a complex signal (IQBU*$e^{j\Phi}$) and the DCOC parameters, Isdc+jQsdc, which correspond to the unscaled estimated DC term.

The complex mixer 412 is coupled to a constant value multiplier 482. The constant value multiplier 482 receives the DC offset parameters (IQBU*$e^{j\Phi}$) and an attenuation value K. The constant value multiplier 482 multiplies the DC offset parameters (IQBU*$e^{j\Phi}$) by the attenuation value K to compensate for the attenuation caused by the AAF 270. The constant value multiplier 482 generates an output (K*IQBU*$e^{j\Phi}$), which is the attenuated estimated DCOC.

The constant value multiplier 482 is coupled to the multiplier 484. The multiplier 484 receives the output K*IQBU*$e^{j\Phi}$ from the constant value multiplier 482 and multiplies the output K*IQBU*$e^{j\Phi}$ by a value equal to 1/(accumulator window length) in order to scale the output K*IQBU*$e^{j\Phi}$ to an average value of the estimated DCOC, which is equivalent to K*IQBU*$e^{j\Phi}$/(accumulator window length). Recall from FIG. 3, that the accumulator output is the sum of the DC estimate over the entire window length, where the window length is determined by the parameters accstart and accstop. Because the accumulator gathers the sum of DC estimates, with proper window parameters and estimates, the value of U is approximately equal to 1/(accumulator window length).

The multiplier 484 is coupled to the complex multiplier 486. The estimated DC offset, K*IQB*$e^{j\Phi}$, is up converted to the IF frequency before it is subtracted from residual DC offset provided from node J. The multiplier 486 receives the estimated DC offset from the multiplier 484 and multiplies it by a complex input $e^{j(wt)}$ to up convert the estimated DC offset to the IF frequency, K*IQB*$e^{j(wt+\Phi)}$. At this point, the output signal generated by the complex multiplier 486, which includes only the estimated DCOC, is substantially identical to the output signal generated by the converter block 490 at node J, which includes the value of the residual DCOC and GSM baseband signal.

The complex multiplier 486 is coupled to the subtractor 488. The subtractor 488 receives the up converted and estimated DCOC (K*IQB*$e^{j(wt+\Phi)}$) output from the complex multiplier 486, and subtracts it from the output from the converter block 490 (at node J) to generate a baseband output signal centered at DC with the DCOC removed at node L. In other words, when the signals from the converter block 490 and the complex multiplier 486 are subtracted by the subtractor 488, the residual DCOC (Idc+jQdc) is eliminated.

FIGS. 7-10 are graphs comparing DC offset removal in a conventional receiver and DC offset removal of a receiver implementing aspects of the Rx DCOC System of the present invention. In FIGS. 7 and 8, signals 702 and 802 are the signal without an addition of a DC offset, signals 704 and 804 indicate the output of the receiver with an added DC offset, and signals 706 and 806 indicates the output of the receiver.

FIG. 7 shows gain (dB) versus frequency (Hz) in a conventional receiver that uses a high pass filter (HPF) for DC offset removal. Signal 702 is an output signal without DC Offset added at input and without going through the RX DCOC system (target). Signal 704 shows an output signal with DC Offset added at input and the RX DCOC System being bypassed (starting point). Signal 706 shows an output signal with DC Offset added at input and going through the RX DCOC system (actual). The circled frequency band 708 highlights the gain distortion found in the traditional (FIR HPF) receiver structure. As illustrated, signals 702 and 706 do not coincide (e.g., gain distortion is evident).

FIG. 8 shows gain (dB) versus frequency (Hz) in a receiver implementing aspects of the Rx DCOC System for DC offset removal of the present invention. The signal 802 is an output signal without DC Offset added at input and without going through the RX DCOC system (target). The signal 804 is an output signal with DC Offset added at input and the RX DCOC System being bypassed (starting point). The signal 806 shows an output signal with DC Offset added at input and going through the RX DCOC system (actual). The circled frequency band 808 highlights the substantially reduced gain distortion found in the receiver implementing aspects of the Rx DCOC System for DC offset removal of the present invention. In particular, signals 802 and 806 are substantially identical and coincide (e.g., gain distortion is minute).

FIG. 9 is a graph of showing phase angle (radians) versus frequency (Hz) in a conventional receiver implementing a high pass filter (HPF) for DC offset removal. The circled frequency band 908 highlights the phase distortion found in the traditional receiver, which uses a FIR HPF.

FIG. 10 shows phase angle (radians) versus frequency (Hz) in a receiver implementing aspects of the Rx DCOC System for DC offset removal in accordance with the present invention. A circled frequency band 1008 highlights the substantially reduced phase distortion found in the receiver implementing aspects of the Rx DCOC System for DC offset removal.

From the graphs (FIGS. 8 and 10), it can be seen that DC offset removal in a receiver 205 implementing the Rx DCOC System 200 outperforms a receiver implementing a traditional HPF for DC offset removal (FIGS. 7 and 9) without causing gain and phase distortion. That is, the gain/phase distortion at VLIF frequency (equivalent DC component after down conversion) in a conventional HPF is much larger than in a receiver 105 of the present invention. Thus, according to the techniques described above, the DC offset can be removed using both hardware and DSP components to preserve signal quality without causing additional latency.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded as illustrative rather than restrictive, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

The invention claimed is:

1. A wireless receiver that processes a digital signal having an in-phase (I) signal component including a first, actual DC Offset Component (DCOC) and a quadrature-phase (Q) signal component including a second, actual DCOC, the wireless receiver comprising:
 a hardware (HW) block for receiving and processing the digital signal to produce a residual DCOC centered at DC, and generating parameters that estimate the residual DCOC, wherein the HW block includes,
  an I path for receiving the I signal component, and generating first parameters comprising a first residual DCOC estimate centered at DC and a first residual DCOC, wherein the first residual DCOC estimate comprises a first estimated DCOC value equal to a sum of first residual DCOCs accumulated during an accumulation period; and
  a Q path for receiving the Q signal component, and generating second parameters comprising a second residual DCOC estimate centered at DC and a second residual DCOC, wherein the second residual DCOC estimate comprises a second estimated DCOC value equal to a sum of second residual DCOCs accumulated during the accumulation period;
 a converter block coupled to the HW block that receives the residual DCOC centered at DC and converts the residual DCOC centered at DC to a residual DCOC centered at intermediate frequency (IF), wherein the converter block includes,
  a first IQ balance unit that receives a first complex IF signal including the first and second residual DCOC centered at DC;
  a first complex mixer coupled to the first IQ balance unit that up converts the complex IF signal to a first baseband signal $(IQB^* e^{j(wt+\phi)})$;
  an anti-alias filter (AAF) coupled to the first complex mixer that attenuates the first baseband signal by an attenuation factor K to generate an attenuated baseband signal $(KIQB^* e^{j(wt+\phi)})$; and
  a down sampler coupled to the AAF to down sample the attenuated baseband signal by a predetermined factor to generate a second, down converted baseband signal including the residual DCOC centered at IF; and
 a digital signal processor (DSP) coupled to the HW block and the converter block that receives the residual DCOC centered at IF from the converter block and the parameters from the HW block, and uses the parameters to eliminate the residual DCOC, and generate a baseband signal that is substantially free of the DCOC.

2. The wireless receiver of claim 1, wherein the DSP comprises:
 a second IQ balance unit that receives the parameters from the HW block, wherein the parameters comprise a second complex value including the composite DCOC estimate (Iudc+jQudc), and generates a third complex value IQBU based on the second complex value;
 a second complex mixer coupled to the second IQ balance unit that multiplies the third complex value with a complex input $(e^{j\phi})$ to generate a complex value $(IQBU^* e^{j\phi})$ having DCOC parameters, Isdc+jQsdc; and
 a plurality of multipliers coupled to the second complex mixer to transform the complex signal $(IQBU^* e^{j\phi})$ to an up converted complex signal $(K^* IQB^* e^{j(wt+\phi)})$.

3. The wireless receiver of claim 2, wherein the DSP further comprises:
 a subtractor coupled to the down sampler and the plurality of multipliers for subtracting the up converted complex signal from the residual DCOC centered at IF to eliminate the residual DCOC and generate a baseband output signal centered at DC.

4. A wireless receiver that receives an RF signal and eliminates a DC Offset Component (DCOC) therefrom, the wireless receiver comprising:
 a low noise amplifier (LNA) that amplifies the RF signal;
 a mixer coupled to the LNA that receives the amplified RF signal and mixes the amplified RF signal with a Local Oscillator (LO) signal to generate an intermediate frequency (IF) signal having a DCOC;
 an analog baseband processor, coupled to the mixer, that receives the IF signal having the DCOC, amplifies the IF signal, and produces an amplified IF signal having the DCOC;
 a fast DC adapt unit, coupled to the analog baseband processor, that receives the amplified IF signal and reduces the DCOC thereof, and generates an amplified signal having a partially reduced DCOC;
 a sigma delta modulator, coupled to the analog baseband processor and the fast DC adapt unit, that receives the amplified signal having the partially reduced DCOC, and an additional DCOC, and converts the amplified signal having the partially reduced DCOC, and the additional DCOC, into a first digital signal having a first DCOC; and
 a SINC filter, coupled to the sigma delta modulator and the fast DC adapt unit, that receives the first digital signal and generates a first IF signal centered at a real IF frequency and having the first DCOC, wherein the first IF signal has an in-phase (I) signal component and a quadrature-phase (Q) signal component;
 a hardware (HW) block that receives the first intermediate frequency (IF) and the first DCOC, wherein the HW block includes:
  means for removing a portion of the first DCOC,
  means for generating a first IF signal and a residual DCOC centered at DC, wherein the residual DCOC comprises the remaining portion of the first DCOC, and
  means for generating parameters that estimate the residual DCOC;
 a converter block, coupled to the HW block, that receives the first IF signal and the residual DCOC, and generates a first baseband signal centered at DC and the residual DCOC centered at IF, wherein the converter block includes:
  an IQ balance and complex mixer block that balances and down converts the first IF signal and the residual DCOC centered at DC to produce a GSM baseband signal centered at DC with DCOC at IF frequency;
  an anti-aliasing filter (AAF), coupled to the IQ balance and complex mixer block, that receives the GSM baseband signal and the residual DCOC at IF frequency and generates a bandwidth limited signal centered at DC and the residual DCOC centered at IF frequency; and
  a down sampler, coupled to the AAF, that receives the bandwidth limited baseband signal plus residual DCOC at IF frequency, and reduces a sampling rate thereof by down sampling the signal by a predetermined factor; and a digital signal processor (DSP), coupled to the HW block and the converter block, wherein the DSP receives the first baseband signal centered at DC and the residual DCOC centered at IF and the parameters to estimate the residual DCOC, wherein the DSP includes:
    means for removing the residual DCOC using the parameters, and
    means for generating a second baseband signal centered at DC that is substantially free of the first DCOC and the residual DCOC, and
wherein the DSP receives the second baseband signal centered at DC with residual DCOC at IF frequency and the parameters to estimate the residual DCOC, uses the parameters to substantially eliminate the residual DCOC, and generates the second baseband signal that is substantially free of the first DC offset component and the residual DCOC.

5. The wireless receiver of claim 4, wherein the HW block further comprises:
    an in-phase (I) path that receives the in-phase (I) signal component of the first IF signal and the first DCOC in in-phase, and generates first parameters comprising a first residual DCOC estimate, and a first residual DCOC; and
    a quadrature (Q) path that receives the quadrature-phase (Q) signal component of the first IF signal and the first DCOC in Q phase, and generates second parameters comprising a second residual DCOC estimate and a second residual DCOC.

6. The wireless receiver of claim 5, wherein the in-phase (I) path, comprises:
    a first all-pass filter (APF) that receives the in-phase (I) signal component;
    a first low-pass filter (LPF) coupled to the APF that receives the in-phase (I) signal component;
    a first latch having an input coupled to the first LPF, for storing the first DCOC estimate when a hold delay time starts, wherein the first latch stops storing the first DCOC estimate and holds the first DCOC estimate when the hold delay time expires;
    a first subtractor coupled to the first APF, and one of the first LPF and the first latch by way of a first switch, wherein a position of the first switch is controlled by the value of the hold delay parameter, wherein in a first position the first switch connects the first LPF and the first subtractor when the hold delay parameter has a first value such that the in-phase signal is continuously subtracted from an output of the first LPF, and in a second position the first switch connects an output of the first latch with the first subtractor when the hold delay parameter has a second value such that the in-phase (I) signal component passes through the first APF so that the first subtractor subtracts the first DCOC estimated stored in the first latch;
    a second subtractor, coupled to the first latch, for subtracting the first DCOC estimate held in the first latch from a first actual DCOC in the in-phase (I) signal component output when the hold delay time expires such that a first residual DCOC remains that comprises the difference between the first actual DCOC and the first DCOC estimate; and
    a first accumulator coupled to the second subtractor for accumulating the difference between the first actual DCOC and the first DCOC estimate during an accumulation period defined by an accumulation start parameter and an accumulation stop parameter, the first accumulator generating a first residual DCOC estimate centered at DC, wherein the first residual DCOC estimate comprises a sum of the difference between the first actual DCOC and the first DCOC estimate accumulated over the accumulation period.

7. The wireless receiver of claim 6, wherein the Q path comprises:
    a second all-pass filter (APF) that receives the Q phase signal component;
    a second low-pass filter (LPF) that receives the Q phase signal component;
    a second latch having an input coupled to the second LPF for storing the second DCOC estimate when the hold delay time starts, wherein the second latch stops storing the second DCOC estimate and holds the second DCOC estimate when the hold delay time expires;
    a third subtractor coupled to the second APF, and one of the second LPF and the second latch by way of a second switch, wherein a position of the second switch is controlled by the value of the hold delay parameter, wherein in a first position the second switch connects the second LPF and the third subtractor such that the Q phase signal is continuously subtracted from the second LPF output, and in a second position the second switch connects an output of the second latch with the subtractor such that the Q phase signal component passes through the second APF so that the second subtractor subtracts the second DCOC estimate stored in the second latch;
    wherein the third subtractor generates the second residual DCOC;
    a fourth subtractor coupled to the second latch, that subtracts the second DCOC estimate held in the second latch from a first actual DCOC in the Q phase signal component when the hold delay time expires such that a second residual DCOC estimate remains that comprises the difference between the first actual DCOC in the Q phase and the second DCOC estimate;
    a second accumulator coupled to the fourth subtractor for accumulating second residual DCOC during an accumulation period defined by an accumulation start parameter and an accumulation stop parameter, wherein the second accumulator generates a second residual DCOC estimate centered at DC, wherein the second residual DCOC estimate comprises the sum of second residual DCOCs accumulated over the accumulation period; and
    a complex multiplier coupled to the second accumulator for multiplying the second residual DCOC estimate via a complex multipler to generate a complex second residual DCOC estimate centered at DC.

8. The wireless receiver of claim 7, further comprising:
    an adder coupled between the I path and the Q path for adding the first residual DCOC estimate and the complex second residual DCOC estimate to generate a composite DCOC estimate.

9. The wireless receiver of claim 8, wherein the residual DCOC comprises a first residual DCOC and a complex second residual DCOC, and wherein the IQ balance and complex mixer unit comprises:
    a first IQ balance unit that receives a first complex IF signal including the first and second residual DCOC centered at DC, and compensates for an I/Q gain/phase mismatch;
    a first complex mixer coupled to the first IQ balance unit that up converts the complex IF signal to a first baseband signal $(IQB*e^{j(wt+\phi)})$;
    an anti-alias filter (AAF) coupled to the first complex mixer that attenuates the first baseband signal by an attenuation factor K to generate an attenuated baseband signal $(KIQB*e^{j(wt+\phi)})$; and a down sampler coupled to the AAF to down sample the attenuated baseband signal by a predetermined factor to generate a second, down converted baseband signal including the residual DCOC centered at IF.

10. The wireless receiver of claim 9, wherein the down sampler down samples the attenuated residual DCOC signal (KIQB*$e^{j(wt+\phi)}$) and the second baseband signal to produce a third baseband signal centered at DC and the residual DCOC centered at IF frequency without substantial distortion.

11. The wireless receiver of claim 10, wherein the DSP comprises:

a second IQ balance unit that receives the parameters from the HW block, wherein the parameters comprise a second complex signal including the composite DCOC estimate (Iudc+jQudc), and generates a third baseband signal IQBU based on the second complex signal;

a second complex mixer coupled to the second IQ balance unit that mixes the third baseband signal with a complex input ($e^{j\phi}$) to generate a complex signal (IQBU*$e^{j\phi}$) having DCOC parameters, Isdc+jQsdc; and a plurality of multipliers coupled to the second complex mixer to transform the complex signal (IQBU*$e^{j\phi}$) to an up converted complex signal (K* IQB*$e^{j(wt+\phi)}$).

12. The wireless receiver of claim 11, wherein the DSP further comprises:

a subtractor coupled to the down sampler and the plurality of multipliers for subtracting the up converted complex signal from the residual DCOC centered at IF to eliminating the residual DCOC and generate a baseband output signal centered at DC.

* * * * *